United States Patent
Horch et al.

(10) Patent No.: US 10,032,784 B2
(45) Date of Patent: Jul. 24, 2018

(54) ONE-TIME PROGRAMMABLE BITCELL WITH NATIVE ANTI-FUSE

(71) Applicant: Synopsys, Inc., Mountain View, CA (US)

(72) Inventors: Andrew E. Horch, Seattle, WA (US); Martin L. Niset, Seattle, WA (US); Ting-Jia Hu, Seattle, WA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/661,776

(22) Filed: Jul. 27, 2017

(65) Prior Publication Data

US 2018/0033795 A1 Feb. 1, 2018

Related U.S. Application Data

(60) Provisional application No. 62/367,527, filed on Jul. 27, 2016.

(51) Int. Cl.
| | |
|---|---|
| *G11C 17/16* | (2006.01) |
| *H01L 27/112* | (2006.01) |
| *H01L 29/08* | (2006.01) |
| *H01L 23/525* | (2006.01) |
| *H01L 23/528* | (2006.01) |
| *H01L 29/10* | (2006.01) |

(Continued)

(52) U.S. Cl.
CPC ........ *H01L 27/11206* (2013.01); *G11C 17/16* (2013.01); *G11C 17/18* (2013.01);
(Continued)

(58) Field of Classification Search
CPC .......... H01L 27/11206; H01L 23/5252; H01L 23/528; H01L 29/0649; H01L 29/0847;
(Continued)

(56) References Cited

U.S. PATENT DOCUMENTS 7,638,855 B2 * 12/2009 Lung ................... H01L 23/5252
257/50
7,755,162 B2 * 7/2010 Kurjanowicz ......... G11C 17/16
257/288

(Continued)

OTHER PUBLICATIONS

"Kilopass Embedded XPM Technology: A new Field Programmable Non-Volatile Memory," Kilopass Corporation, Jan. 29, 2009, 9 pages.

(Continued)

*Primary Examiner* — Eric Ward
(74) *Attorney, Agent, or Firm* — Fenwick & West LLP

(57) ABSTRACT

An OTP memory device includes a first and a second doped region of the same polarity in a semiconductor substrate. The second doped region has a higher doping concentration than the first doped region. A source region and a drain region of an opposite polarity are also in the semiconductor substrate. The source is positioned over the lower doped region, and the drain is positioned over the higher doped region. A plurality of anti-fuse devices, separated from each other by a portion of the lower doped region, are each positioned at least partially above a respective portion of the source region (and, in turn, above the lower doped region). A first metal line is coupled to a first subset of the anti-fuse devices, and a second metal line is coupled to a different, second subset of the anti-fuse devices arranged between the anti-fuses in the first subset.

21 Claims, 6 Drawing Sheets

(51) Int. Cl.
*H01L 29/423* (2006.01)
*H01L 29/06* (2006.01)
*G11C 17/18* (2006.01)

(52) U.S. Cl.
CPC ........ *H01L 23/528* (2013.01); *H01L 23/5252* (2013.01); *H01L 29/0649* (2013.01); *H01L 29/0847* (2013.01); *H01L 29/1033* (2013.01); *H01L 29/42364* (2013.01)

(58) Field of Classification Search
CPC ........... H01L 29/1033; H01L 29/42364; G11C 17/16–17/18
See application file for complete search history.

(56) References Cited

U.S. PATENT DOCUMENTS

| | | | |
|---|---|---|---|
| 8,644,049 B2 | 2/2014 | Chung | |
| 8,724,363 B2* | 5/2014 | Lu | H01L 27/11206 365/94 |
| 8,848,423 B2* | 9/2014 | Chung | H01L 27/1211 365/148 |
| 8,933,492 B2* | 1/2015 | Kurjanowicz | H01L 23/5252 257/209 |
| 9,007,805 B2 | 4/2015 | Lu et al. | |
| 9,224,496 B2* | 12/2015 | Chung | G11C 17/12 |
| 2006/0203591 A1* | 9/2006 | Lee | G11C 17/16 365/225.7 |
| 2007/0183181 A1 | 8/2007 | Peng et al. | |
| 2014/0035014 A1 | 2/2014 | Jeon | |
| 2015/0078062 A1 | 3/2015 | Lu et al. | |

OTHER PUBLICATIONS

Kurjanowicz, W., "Evaluating Embedded Non-Volatile Memory for 65nm and Beyond," DesignCon 2008, Sidense Corp., 2008, 23 pages.

Kurjanowicz, W., "Evaluating Embedded Non-Volatile Memory for 65nm and Beyond," DesignCon 2008, International Engineering Consortium, DesignCon 2008, Feb. 4-7, 2008, pp. 176-188.

* cited by examiner

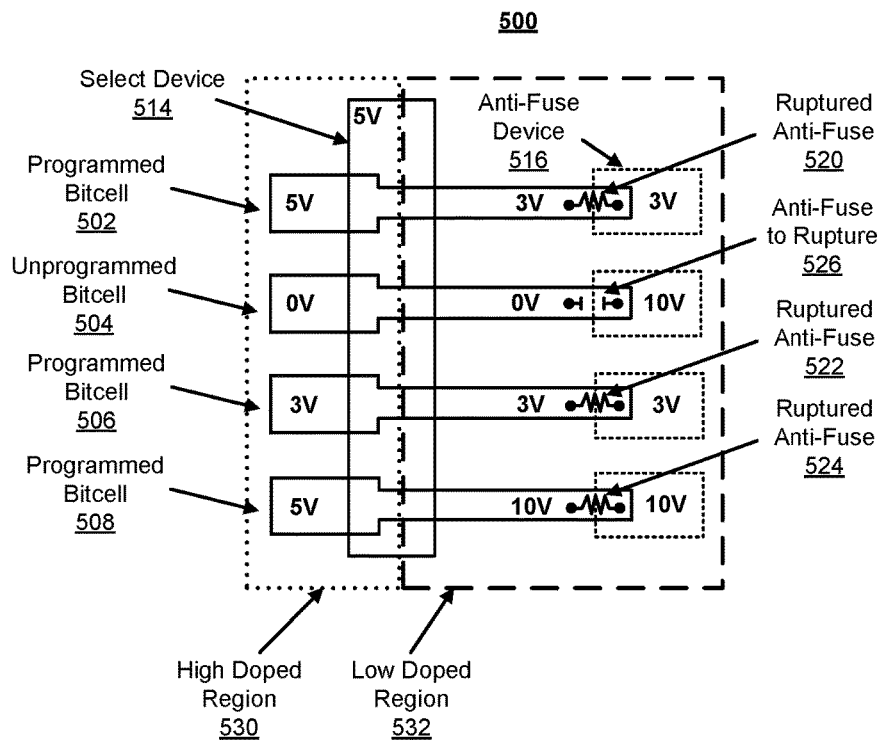
FIG. 5
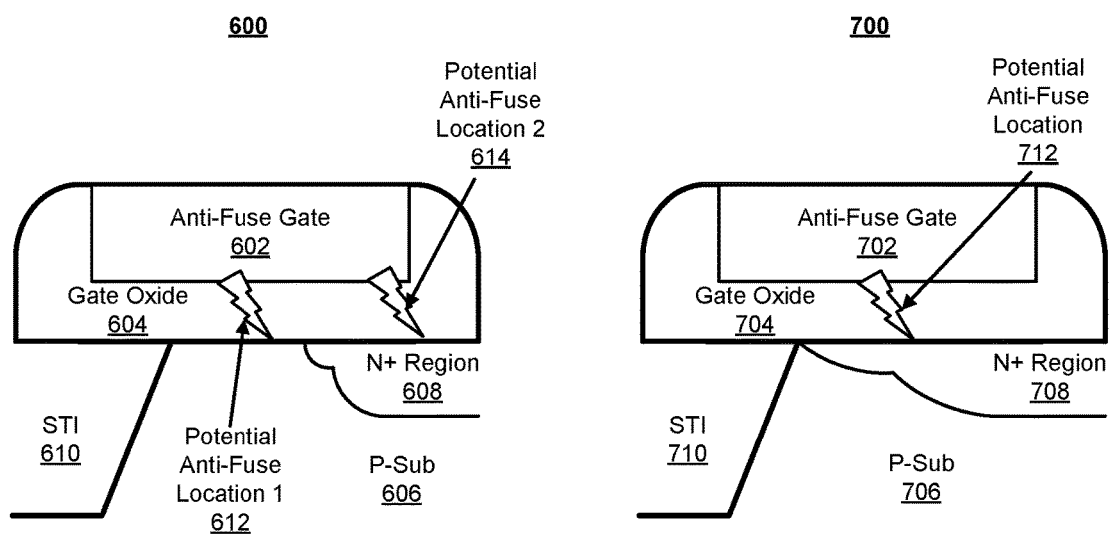
FIG. 6  FIG. 7

| | BL selected | BL unselected | WL1 | WL2 | Select Gate | Unselected Row WL1 & 2 | Vfuse WL1 | Vfuse WL2 |
|---|---|---|---|---|---|---|---|---|
| Read Selected Row | 0 | 0 | 0 or VDD | 0 or VDD | VDD_IO | 0 | VDD or 0 | VDD or 0 |
| Read unselected Row | 0 | 0 | 0 | 0 | 0 | 0 | 0 | 0 |
| Prog WL1 Selected Row Rupt | 0 | Vinhibit | Vrupt | Vinhibit | Vinhibit | 0 | Vrupt | VT:N |
| Prog WL1 Selected Row - Inhibit | Vinhibit | Vinhibit | Vrupt | Vinhibit | Vinhibit | 0 | Vrupt-(Vinhibit - VT:N) | VT:N |
| Prog WL2 Selected Row - Rupt | 0 | Vinhibit | Vinhibit | Vrupt | Vinhibit | 0 | VT:N | Vrupt |
| Prog WL2 Selected Row - Inhibit | Vinhibit | Vinhibit | Vinhibit | Vrupt | Vinhibit | 0 | VT:N | Vrupt-(Vinhibit - VT:N) |
| Prog Unselected Row | 0 or Vinhibit | 0 or Vinhibit | 0 | 0 | 0 | 0 | 0 | 0 |

FIG. 8

ONE-TIME PROGRAMMABLE BITCELL WITH NATIVE ANTI-FUSE

CROSS REFERENCE TO RELATED APPLICATION

This application claims the benefit of U.S. Provisional Application No. 62/367,527, entitled "ONE-TIME PROGRAMMABLE (OTP) BITCELL WITH NATIVE NMOS FUSE," filed Jul. 27, 2016, which is incorporated by reference herein in its entirety.

BACKGROUND

This disclosure relates to one-time programmable bitcell, and more specifically to a one-time programmable bitcell with reduced leakage at its anti-fuse device.

As the semiconductor industry continues to integrate more and more devices onto a single chip, the need for OTP memory on BCD (Bipolar CMOS DMOS) processes is increasing. High voltage devices (DMOS) are being added to standard logic (CMOS) processes. For example, LCD screens used on many smart phones and other screens use thin film transistors that operate at 32V. Accelerometers used to sense orientation in smart phones, acceleration in anti-lock brakes, and other MEMS devices usually operate between 40V and 60V. This has resulted in many BCD process that combine small, low voltage CMOS devices, high voltage DMOS devices, IO/bridge devices (typically 5V CMOS devices), and other devices all on one chip.

There is a desire to add NVM (Non Volatile Memory) into these chips as well. The NVM can be used to store analog calibration values. As one example, gamma correction for LCD screens can be stored in the NVM. When LCD screens are mass produced, the screens are designed to produce exactly the same color intensities. To correct for manufacturing variations, each screen is tested and a correction value (gamma) is stored on the LCD control chip to compensate for any small variation in manufacturing. As another example, code used by MEMS microcontroller chips can be stored as NVM on BCD chips. Currently available memory devices include EEPROM and eFLASH, both of which have disadvantages. eFLASH has a very small bitcell, but it requires steps in addition to the standard CMOS process, which increases the cost of producing the bitcell and may change the performance or characteristics of the produced devices. EEPROM is compatible with standard CMOS processes, but has a relatively large bitcell size, and thus is only suitable for low bit count memories.

As an alternative, One-Time Programmable (OTP) Gate Oxide rupture memories can be used as NVM on BCD chips. OTP Gate Oxide memories typically include an anti-fuse device having a thin oxide layer and a select device having a thicker oxide layer. The anti-fuse and select devices are connected in series. OTP Gate Oxide memories typically use an electric field of around 30 MV/cm to rupture anti-fuses in the thin oxide of the anti-fuse devices. This 30 MV/cm is a compromise voltage that balances the demands of programming speeds and stresses on the chip. Many applications program the OTP memory at test, and testing time is a significant portion of the total manufacturing cost of a chip. Using higher voltages reduces the programming time, thus reducing test costs and overall manufacturing cost. However, higher voltages place higher stress on the other devices in the memory, including the select device in the bitcell. Typically, 30 MV/cm provides a reasonable programming time and tolerable amount of stress on the peripheral devices. In a typically 0.13 um 1.5V/5V process, 30 MV/cm on the 1.5V device is around 10V. However, a 10V rupture voltage is often higher than the diode breakdown voltage between the source/drain and the well in which the bitcell is formed; the diode breakdown voltage is usually around 8.5V. As anti-fuses are blown during programming, a common leakage path between bitcells is created. The combined leakage of many previously-programmed bitcells makes it difficult to blow the anti-fuses in later-programmed bitcells.

SUMMARY

Embodiments relate to an one-time programmable (OTP) memory device having anti-fuse devices separated by a doped region. The OTP memory device has an increased breakdown voltage between a doped region and a source region by using a low doping concentration in the substrate region below the anti-fuse. The OTP memory device may have at least two independent wordlines for applying different voltages to anti-fuse devices of adjacent bitcells to prevent punch-through between adjacent bitcells.

In some embodiments, the OTP memory device includes a first and a second doped region of the same polarity in a semiconductor substrate. The second doped region has a higher doping concentration than the first doped region. A source region and a drain region of the same polarity, opposite the polarity of the first and second doped region, are also in the semiconductor substrate. The source region is positioned over the first doped region (with the lower doping concentration), and the drain region is positioned over the second doped region (with the higher doping concentration). A select device forms a channel in a channel region between the source and the drain. A plurality of anti-fuses, separated from each other by a portion of the first doped region, are each positioned at least partially above a respective portion of the source region (and, in turn, above the lower-doped first region). A first metal line is coupled to a first subset of the anti-fuse devices, and a second metal line is coupled to a different, second subset of the anti-fuse devices. Each anti-fuse device in the first subset is positioned between a respective pair of anti-fuse devices in the second subset; in other words, the anti-fuses in the first subset are adjacent to anti-fuses in the second subset, and are not directly adjacent to other anti-fuses in the first subset, and vice versa.

BRIEF DESCRIPTION OF DRAWINGS

FIG. 5 is a top view of an OTP memory device being programmed according to one embodiment.

FIG. 6 is a cross sectional diagram of an anti-fuse device with two potential anti-fuse locations, according to one embodiment.

FIG. 7 is a cross sectional diagram of an anti-fuse device in which the source region extends further into the anti-fuse device, according to one embodiment.

FIG. 8 is a table of operation voltages of an OTP memory device according to one embodiment.

DETAILED DESCRIPTION

Figure 1:
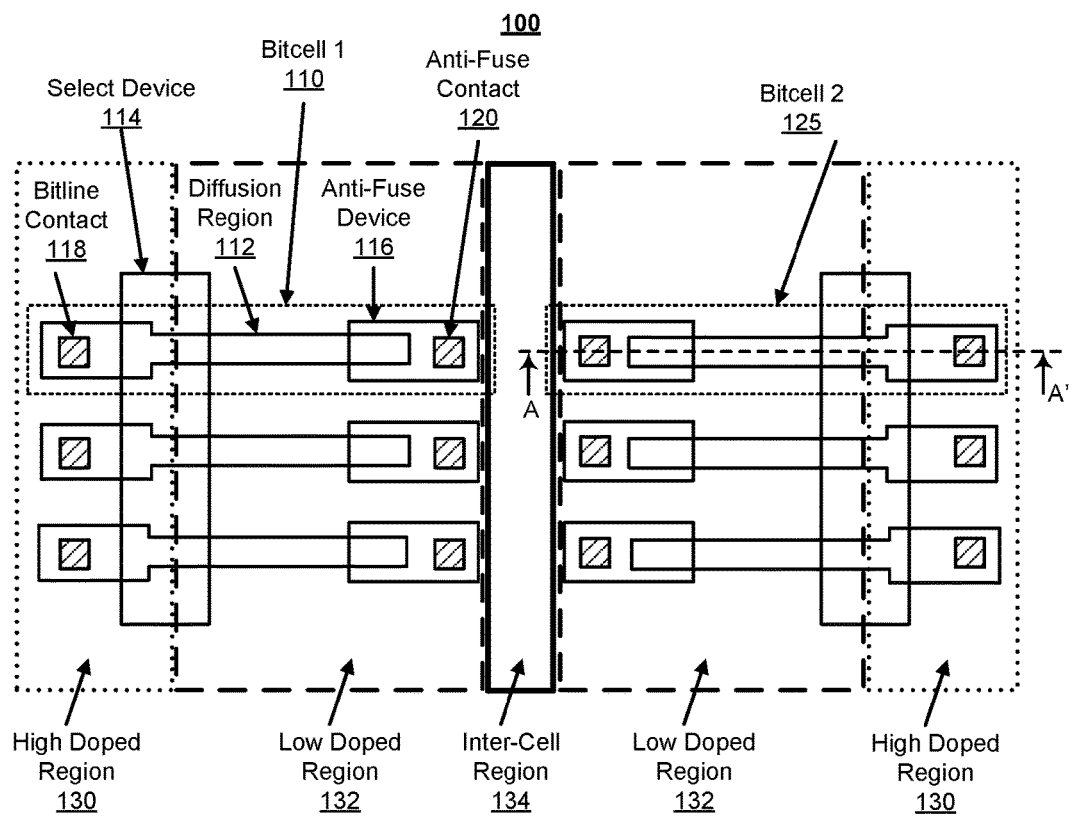
FIG. 1 illustrates a top view of an OTP memory device, according to one embodiment.

Embodiments relate to a one-time programmable (OTP) memory device that uses low doping in an anti-fuse region so that the voltage needed to rupture an anti-fuse and program a cell is higher than the breakdown voltage between the low doped region and a source region. The OTP memory device also uses two wordlines to independently control the voltages of adjacent anti-fuse devices to prevent punch-through between adjacent bitcells.

To reduce or remove leakage around the anti-fuse devices from previously-programmed gate rupture bitcells caused by a low diode breakdown voltage, the anti-fuse devices can be placed in a region with lower doping than a typical well. The breakdown voltage between a source/drain region (e.g., an N-doped source/drain, or "N+SD") and an opposite-doped well (e.g., a P-well) increases as the doping concentration of the well decreases. In a typical CMOS process, the P-well has a concentration on the order of $10^{17}$ dopant ions/cm³, while a substrate with native p-doping (referred to as "native" or "P-sub") has a dopant concentration on the order of $10^{15}$ dopant ions/cm³. If the N+SD region is placed in a P-sub region rather than a P-well, the breakdown voltage is much higher. Thus, to reduce leakage around the anti-fuse devices, the anti-fuse devices can be placed in a lower doped region, such as a P-sub region, rather than a P-well. The use of a low doped region is described below in detail with reference to FIGS. 1 and 2.

However, when the doping concentration around the anti-fuse devices is too low, punch-through can occur between adjacent bitcells. Punch-through occurs when the depletion regions of two nearby reverse biased diodes touch. When the depletion regions touch, current can flow between the depletion regions, making it difficult to program new bitcells. During programming of a new bitcell, a wordline connected to the anti-fuse devices of the bitcells sets all of the anti-fuse devices on the wordline to a high rupture voltage. In previously programmed bitcells, which have a ruptured gate oxide (i.e., resistive short), the N+SD region is also raised to the high voltage. The N+SD region of a bitcell to be programmed is grounded. If the depletion regions of nearby bitcells merges in the P-sub region, then current can flow between the N+SD region of an already programmed bitcell (which is at a high voltage) and the N+SD region of a bitcell being programmed (which is grounded). This current flow makes it difficult to hold the N+SD region of the bitcell being programmed at ground, and thus makes it difficult to program the new bitcell.

To prevent punch-through, the wordline can be split into two independent wordlines that allow physically adjacent anti-fuse devices to be biased independently. By using two wordlines, the wordline for the bitcells adjacent to the bitcell being programmed can be set at an intermediate voltage that is lower than the rupture voltage. This lower voltage may still pass through the shorted anti-fuse into the N+SD region of the programmed bitcells, but because the voltage is relatively low, there is far less leakage from these adjacent bitcells to the grounded N+SD region of the bitcell being programmed. Thus, the voltage at the N+SD region of the bitcell being programmed can be held at ground and the bitcell can be programmed successfully. Punch-through, and embodiments for preventing punch-through, are described below in detail with reference to FIGS. 3 through 5.

The bitcell may be created using a standard complementary metal-oxide-semiconductor manufacturing processes ("CMOS processes"). "OTP bitcell," "bitcell" or "bit" described herein refers to CMOS type (i.e., transistor based) nonvolatile memory. A CMOS OTP bitcell is distinguished from other types of NVM memory such as magnetic memory, such as is found in floppy disks, or optical memory such as is found in CDs or DVDs. OTP bitcells are produced using a CMOS process that includes a number of process steps in a fabrication facility ("fab").

OTP Memory Device with Low Doped Region

FIG. 1 illustrates a top view of an OTP memory device 100, according to one embodiment. The memory device 100 includes multiple bitcells, such as bitcell 1 110 and bitcell 2 125. Bitcell 1 110 bitcell includes a diffusion region 112, a select device 114, an anti-fuse device 116, a bitline contact 118, and an anti-fuse contact 120. The memory device 100 has a high doped region 130, a low doped region 132, and an inter-cell region 134. The components of each bitcell (e.g., components 112 through 120 of bitcell 1 110) are embedded into or placed on top of the high doped region 130 or low doped region 132. Each bitcell, such as bitcell 2 125 and the other unlabeled bitcells in the memory device 100, includes the same components 112 through 120. While the memory device 100 is shown having six bitcells, the memory device 100 may have many more bitcells than are shown in FIG. 1, and may be arranged differently than shown in FIG. 1.

The diffusion region 112 extends across the bitcell 110. A source and a drain are implanted into the diffusion region 112, shown in and described with respect to FIG. 2. The bitcell 110 has two devices, a select device 114 and an anti-fuse device 116. The select device 114 includes a conductive gate and a thick gate oxide that is below the conductive gate, as described below in detail with reference to FIG. 2. The select device 114 is configured to form a channel in a channel region of the diffusion region 112 between the source and the drain. The bitline contact 118 connects through the thick gate oxide to apply a voltage to a source/drain region next to the select device 114. The anti-fuse device 116 includes a conductive gate and a thin gate oxide below the conductive gate. The anti-fuse contact 120 applies a voltage to the anti-fuse device 116.

A high doped region 130, such as a P-well, is formed under the bitline contacts 118 and a portion of the select device 114. The high doped region 130 may have doping on the order of $10^{17}$ dopant ions/cm³. A low doped region 132, such as P-sub, is under the remainder of the bitcell 110, including a portion of the select device 114, the anti-fuse device 116, and the anti-fuse contact 120. The low doped region 132 may have the native doping of the substrate (P-sub), or the low doped region 132 may be a P-epi (epitaxial) layer or a P-well with a lower doping concentration than the high doped region 130. If the substrate has no doping or very light doping, the low doped region 132 may be doped to a P-sub doping level (on the order of $10^{15}$ dopant ions/cm³). The high doped region 130 may have at least twice the doping concentration of the low doped region 130. An inter-cell region 134 may separate the regions between columns of bitcells. For example, the inter-cell region 134 may be a shallow trench isolation (STI).

Figure 2:
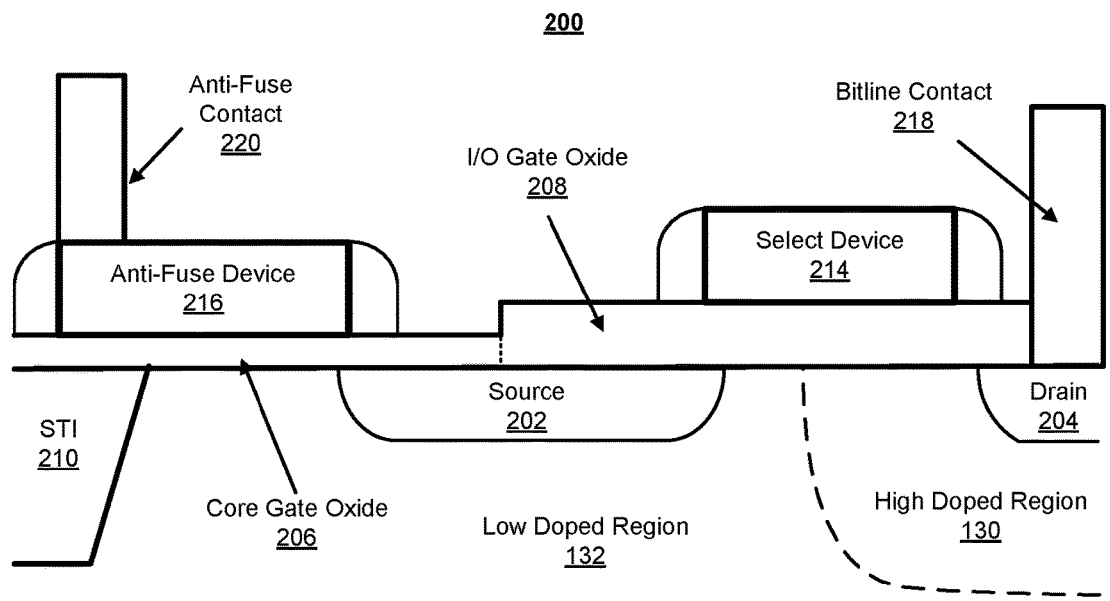
FIG. 2 is a cross sectional diagram an OTP bitcell taken along line A-A' of FIG. 1, according to one embodiment.

FIG. 2 is a cross sectional diagram an OTP bitcell 200 taken along line A-A' of FIG. 1, according to one embodiment. The OTP bitcell 200 corresponds to the bitcell 2 125 in FIG. 1. The bitcell 200 shows many of the same components as bitcell 1 110 in FIG. 1 and is formed on partially on top of the low doped region 132 and partially on top of the high doped region 130. The bitcell 200 includes a source region 202, a drain region 204, a core gate oxide 206, an I/O gate oxide 208, an STI 210, a select device 214, an anti-fuse device 216, a bitline contact 218, and an anti-fuse contact 220.

The source region 202 is formed between the anti-fuse device 216 and the select device 214. The source 202, select device 214, drain 204, I/O gate oxide 208, and bitline contact 218 form a first transistor in which a channel region can form between the source 202 and the drain 204. The channel region includes a portion of the low doped region 132 and a portion of the high doped region 130. The anti-fuse device 216 is used to program the bitcell 200. The anti-fuse device 216 has no source region, and the source 202 acts as a drain of the anti-fuse device 216. The core gate oxide 206 extends under the anti-fuse device 216, and a thicker I/O gate oxide 208 extends under the select device 214. During programming of the bitcell 200, the anti-fuse contact 220 applies a high voltage to the anti-fuse device 216, and the source 202 is grounded. This high voltage difference ruptures a portion of the core gate oxide 206, creating a short or an "anti-fuse" (not shown in FIG. 2) that allows current to flow though the core gate oxide 206 during reading of the bitcell 200.

As shown in FIG. 2, the source 202 is fully within the low doped region 132, and the anti-fuse device 216 and a portion of the select device 214 are atop the low doped region 132. The high doped region 130 extends only under the drain 204, bitline contact 218, and a portion of the select device 214. As discussed above, a junction of a highly doped P-well (e.g., the high doped region 130) and the source 202 would have a relatively low diode breakdown voltage that is lower than the voltage needed to rupture an anti-fuse at the anti-fuse device. By contrast, the junction of the low doped region 132 and source 202 has a diode breakdown voltage that is higher than the voltage needed to rupture an anti-fuse in the core gate oxide 206. In some embodiments, the breakdown voltage between the source 202 and the low doped region 132 is two volts higher than a breakdown voltage between the drain 204 (which has the same doping concentration as the source 202) and the high doped region 130. The doping of the low doped region 132 and/or the source 202 and the drain 204 can be selected based on the rupture voltage and the breakdown voltage.

Preventing Punch-Through in OTP Memory Device with Low Doped Region

Figure 3:
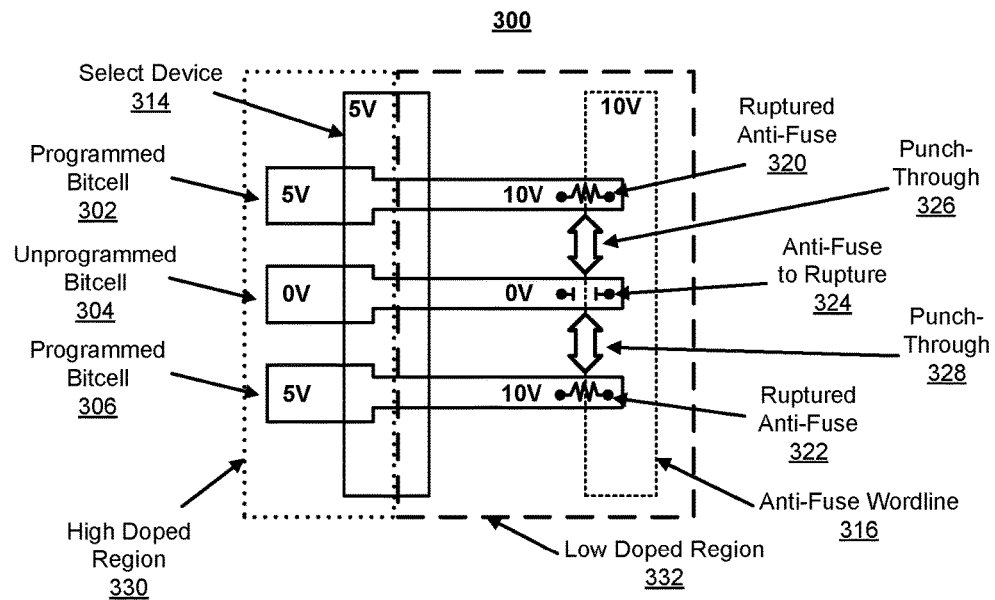
FIG. 3 is a top view of an OTP memory device illustrating punch-through, according to one embodiment.

FIG. 3 is a top view of an OTP memory device 300 illustrating punch-through, according to one embodiment. The memory device 300 includes three bitcells: a programmed bitcell 302, an unprogrammed bitcell 304 next to the programmed bitcell 302, and another programmed bitcell 306 next to the unprogrammed bitcell 304. The memory device 300 includes a select device 314, which is similar to the select device 114 described with respect to FIG. 1. The memory device 300 also includes an anti-fuse wordline 316 that connects to an anti-fuse device in each of the bitcells 302 through 306. The anti-fuse devices connected to the anti-fuse wordline 316, are similar to the anti-fuse device 116 described with respect to FIG. 1. When a voltage is applied to the anti-fuse wordline 316, the same voltage is applied at the anti-fuse device for each of the bitcells 302 through 306. The memory device 300 has a high doped region 330, which is similar to the high doped region 130 of FIG. 1, and a low doped region 332, which is similar to the low doped region 132 of FIG. 1.

After programming, the programmed bitcell 302 has a ruptured anti-fuse 320, represented as a resistor. Similarly, the programmed bitcell 306 has a ruptured anti-fuse 322, also represented as a resistor. When a high voltage (in FIG. 3, 10V) is applied to the anti-fuse wordline 316, the high voltage passes through the ruptured anti-fuses 320 and 322, as shown in FIG. 3. The unprogrammed bitcell 304 has an unruptured anti-fuse 324 that is to be ruptured during programming. When the unprogrammed bitcell 304 is programmed, the source/drain region of the unprogrammed bitcell 304 should be held at a low voltage or grounded, while a high voltage is applied by the anti-fuse wordline 316 to the anti-fuse device of the unprogrammed bitcell 304. This ruptures the anti-fuse 324, creating a short in the core gate oxide. However, punch-through 326 from the ruptured programmed bitcell 302 and punch-through 328 from the ruptured bitcell 306 can make it difficult to rupture the anti-fuse 324 in the unprogrammed bitcell 304. In particular, the high voltage in the programmed bitcells 302 and 306 that passes through the ruptured anti-fuses 320 and 324 can cause the depletion regions of the bitcells 302 and 306 to merge with the depletion region of the unprogrammed bitcell 304. Current leaks from the programmed bitcells 302 and 306 into the source/drain region of the unprogrammed bitcell 304, which should be grounded. This current flow makes it difficult to hold the source/drain region of the unprogrammed bitcell 304 at ground, and thus makes it difficult to program the bitcell 304.

Figure 4:
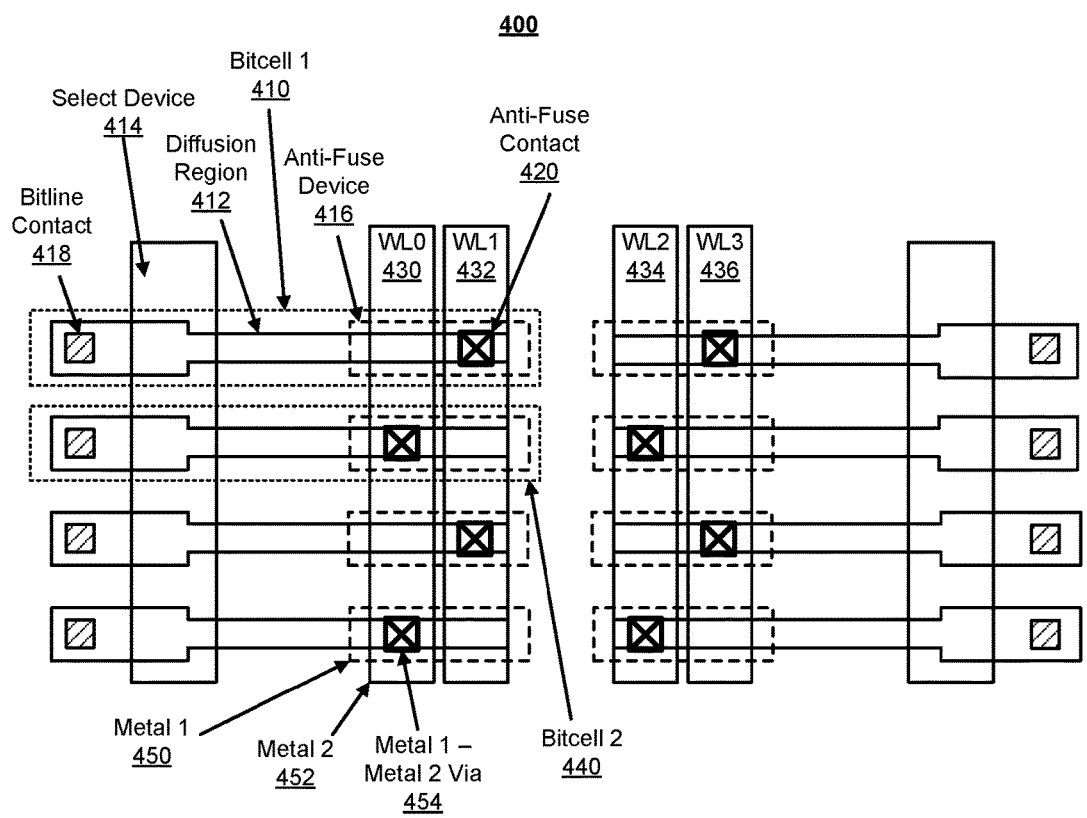
FIG. 4 is a top view of an OTP memory device arranged to prevent punch-through, according to one embodiment.

FIG. 4 is a top view of an OTP memory device 400 arranged to prevent punch-through, according to one embodiment. To prevent punch-through, the anti-fuse wordline 316 can be replaced with multiple anti-fuse wordlines 430 and 432 connected to anti-fuse devices that are separated by a low doped region (e.g., low doped region 132 of FIG. 1). Each bitcell includes an anti-fuse device 416. Adjacent bitcells can be connected to different wordlines. This allows physically adjacent anti-fuse devices to be biased independently. By using two wordlines, the wordline for the bitcells adjacent to the bitcell being programmed can be set at an intermediate voltage that is lower than the rupture voltage. This lower voltage may still pass through the shorted anti-fuse into the source/drain region of the programmed bitcells, but because of the lower voltage, there is far less leakage from these adjacent bitcells to the source/drain region of the bitcell being programmed. Because of this lower voltage on the adjacent source/drain regions, the voltage at the source/drain region of the bitcell being programmed can be held at ground.

In particular, the memory device 400 includes bitcell 1 410 and bitcell 2 440. Bitcell 1 410 has a diffusion region 412, select device 414, anti-fuse device 416, bitline contact 418, and anti-fuse contact 420. These are similar to elements 112 through 120 of FIG. 1. The anti-fuse contact 420 is connected to wordline 1 (WL1) 432. The anti-fuse contact of adjacent bitcell 2 440 is connected to a different wordline, wordline 0 (WL0) 430. The remaining bitcells in the memory device 400 alternate which wordline they are connected to, such that adjacent bitcells in a column are connected to different wordlines. A different voltage can be applied at each wordline 430 and 432 to prevent punch through, as described below in detail with reference to FIG. 5. The memory device 400 has a second column of bitcells which are connected to WL2 434 and WL3 436. Alternating bitcells in this column are connected to WL2 and WL3, such that adjacent bitcells are connected to different wordlines.

An inter-cell region, such as an STI, may separate the two columns of bitcells to prevent current leakage between bitcells in adjacent columns.

To connect each of the anti-fuse devices 416 to one of the wordlines 430 and 432, a via is formed as illustrated in FIG. 4. For example, when an anti-fuse device is formed from metal 1 450, and the wordline is formed from metal 2 452, a metal 1-metal 2 via 454 is formed at each anti-fuse contact 420 between metal 1 450 (the anti-fuse device) and metal 2 452 (the wordline). Thus, a voltage can be applied to metal 2 452, and this voltage is applied to the anti-fuse devices 416 through the via 454. In some embodiments, rather than using two wordlines in a single column of bitcells, three or more wordlines can be used for a single column of bitcells. For example, every third bitcell going down a column can be connected to the same wordline if three wordlines are used.

FIG. 5 is a top view of an OTP memory device 500 being programmed, according to one embodiment. The memory device 500 has four bitcells: a programmed bitcell 502, an unprogrammed bitcell 504, and additional programmed bitcells 506 and 508. The bitcells are connected to two alternating wordlines, such as WL0 430 and WL1 432 shown in FIG. 4. The wordlines (not shown in FIG. 5) apply voltages to anti-fuse devices 516, and a different voltage is applied to the select device 514. The select device 514 is formed partially over a high doped region 530 and partially over a low doped region 532. The anti-fuse devices 516 are formed over the low doped region 532.

The programmed bitcells 502, 506, and 508 each have a ruptured anti-fuse 520, 522, 524. The unprogrammed bitcell 504 has an unruptured antifuse 526 that is to be ruptured during programming. The anti-fuse devices of the first and third bitcells 502 and 506 are set at 3V by a first wordline. The anti-fuse device of the bitcell to be programmed 504 is set at a high voltage of 10V to rupture the anti-fuse 526. The anti-fuse device of the fourth bitcell 508, which has already been programmed, is also set to the high voltage of 10V because it is connected to the same wordline as the unprogrammed bitcell 504. The 3V on the source/drain regions of the adjacent bitcells 502 and 506 is not high enough to cause the depletion regions to merge and current to flow to the unprogrammed bitcell 504 from its adjacent bitcells 502 and 506 (i.e., to create punch-through). Thus, despite being formed in the low doped region 532, the source/drain region of the unprogrammed bitcell 504 can be reliably held to ground during programming of the unprogrammed bitcell 504.

The 3V applied to the anti-fuse devices of the first and third bitcells 502 and 506 is an intermediate voltage, i.e., a voltage in between ground and a high voltage (in this example, 10V) used to rupture the anti-fuse 526. A different intermediate voltage, e.g., 5V, could be used. The intermediate voltage can be selected or optimized based on the high voltage used, the concentration of the low doped region 532, the geometry of the various components of the memory device 500, the programming time, or other factors.

Extending the Source/Drain Region Underneath the Anti-Fuse Device

FIG. 6 is a cross sectional diagram of an anti-fuse device 600 with two potential anti-fuse locations, according to one embodiment. The anti-fuse device 600 includes an anti-fuse gate 602, gate oxide 604, P-sub region 606, N+ region 608, and STI 610. The anti-fuse gate 602 is a conductive gate controlled by a wordline, as described with respect to FIGS. 4 and 5. The gate oxide 604 is a thin gate oxide in which an anti-fuse can be formed by applying a high voltage to the anti-fuse gate 602 and a low voltage (or ground) to the N+ region 608. The N+ region 608 is an n-doped example of a source/drain region, such as source 202 of FIG. 2. The N+ region 608 is a lightly doped drain (LDD) implant that normally is used for a thin gate device. The P-sub region 606 is an example of a low doped region, such as low doped region 130; in this example, the P-sub region 606 has the native doping of a p-doped substrate. STI 610 is a shallow trench isolation region for preventing current leakage.

An rupture can be formed at any point between the anti-fuse gate 602 and the P-sub region 606 or N+ region 608. Two potential anti-fuse locations are shown for the anti-fuse device 600. The potential anti-fuse location 1 612 connects the anti-fuse gate 602 to the P-sub region 606. The potential anti-fuse location 2 614 connects the anti-fuse gate 602 to the N+ region 608. When a high voltage is applied to the anti-fuse gate 602, an anti-fuse at anti-fuse location 1 612 or anti-fuse location 2 614 could be formed. If the anti-fuse is formed between the anti-fuse gate 602 to the P-sub region 606 (e.g., at potential anti-fuse location 1 612), a high resistance path is created. In order to read the programmed bitcell, the voltage applied has to be high enough to form an N-type inversion region between the anti-fuse and the N+ region 608. On the other hand, if the anti-fuse is formed directly between the anti-fuse gate 602 and the N+ region 608 (e.g., at potential anti-fuse location 2 614), a low resistance path is formed, and a lower voltage can be used to read the bitcell. It is desirable for the anti-fuse to be formed at the same location in each bitcell, and in particular, for the anti-fuse to be formed at the potential anti-fuse location 2 in each bitcell.

FIG. 7 is a cross sectional diagram of an anti-fuse device 700 in the source region 708 extends further into the anti-fuse device 700, according to one embodiment. The anti-fuse device 700 includes an anti-fuse gate 702, gate oxide 704, P-sub region 706, N+ region 708, and STI 710. The N+ region 708 is wider than the N+ region 608 shown in FIG. 6. The N+ region 608 has been replaced with an LDD that resembles one normally used in an IO/bridge device; the LDD region is typically larger and more graded in higher voltage devices. The N+ region 708 extends to STI 710, so that the gate oxide 704 is formed entirely over the STI 710 or the N+ region 708. When an anti-fuse is formed in the gate oxide 704, such as at potential anti-fuse location 712, the anti-fuse cannot connect the anti-fuse gate 702 to the P-sub region 706. Instead, the anti-fuse connects the anti-fuse gate 702 directly to the N+ region 708. Thus, the anti-fuse always forms a low resistance path, and a lower voltage can be used to read the bitcell than if the anti-fuse were formed in the memory device 600 of FIG. 6 at potential anti-fuse location 1 612.

Example Table of Operations

FIG. 8 is a table of operation voltages of an OTP memory device according to one embodiment. The table of operation provides the voltage levels at different points in a memory device (given along the top of the table) and for different operations (given along the left side of the table).

In the example of FIG. 8, the bitlines (BL) are arranged as columns, and the select gates and wordlines (WL) are arranged as rows. Each read and program operation has at least two bias conditions, one for the row being read or programmed (selected) and one for the other rows (unselected). WL1 and WL2 refer to two different wordlines connected to alternating bitcells and independently controlled. Vinhibit is the intermediate voltage used to prevent punch-through and when programming is not being performed. Vrupt is the high voltage used to rupture the gate oxide when a bitcell is being programmed. VDD refers to the power supply voltage for the core logic device, such as 1.8V in a 1.8V/5V process. VDD_IO refers to the power supply voltage for the IO logic device, such as 5V in a 1.8V/5V process. VT:N refers to the threshold voltage for the select device, such as 5V.

Overview of Electronic Design Automation Design Flow

Figure 9:
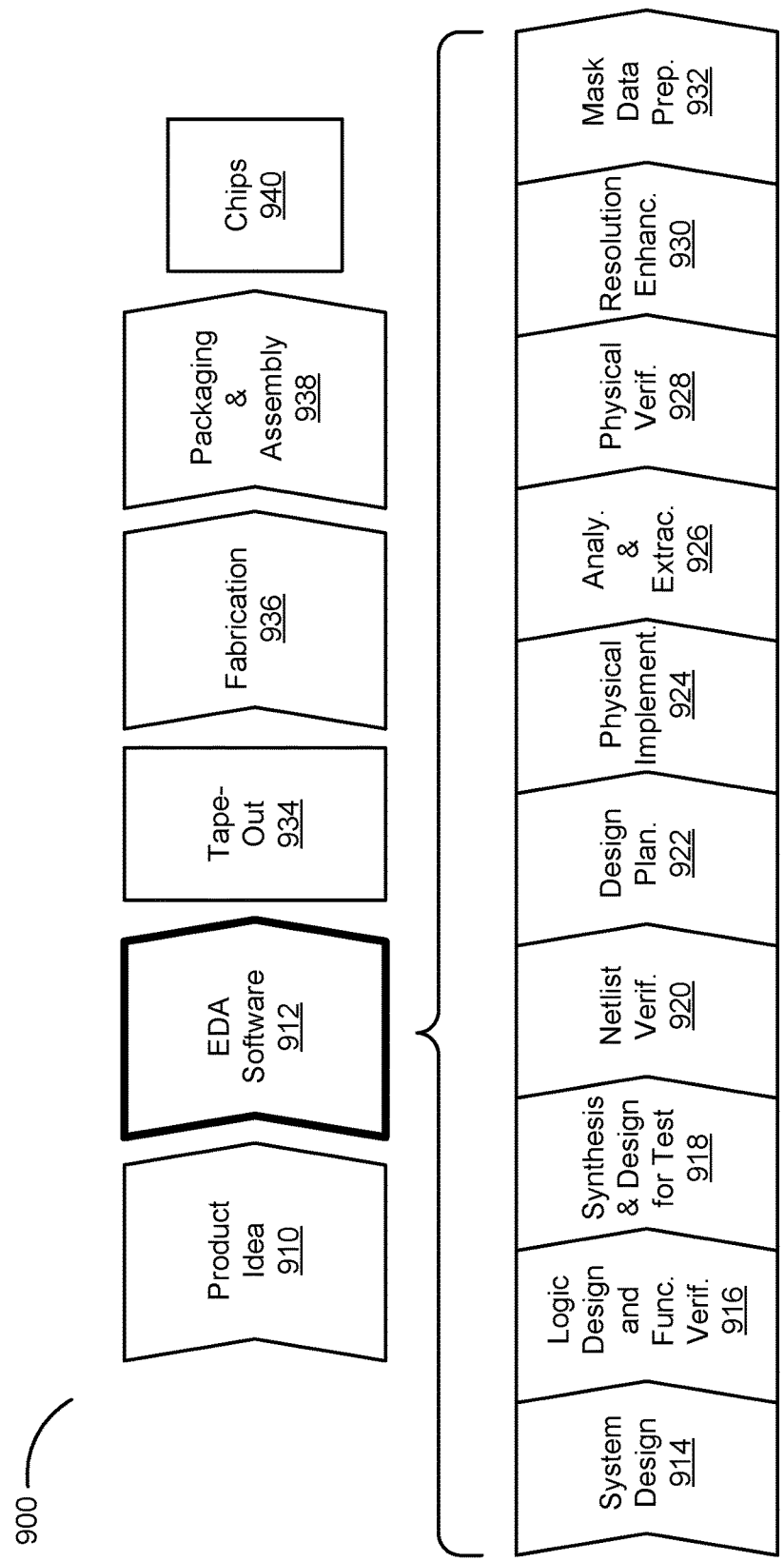
FIG. 9 is a flowchart illustrating the various operations in the design and fabrication of an integrated circuit, according to one embodiment.

FIG. 9 is a flowchart 900 illustrating the various operations in the design and fabrication of an integrated circuit. This process starts with the generation of a product idea 910, which is realized during a design process that uses electronic design automation (EDA) software 912. When the design is finalized, it can be taped-out 934. After tape-out, a semiconductor die is fabricated 936 to form the various objects (e.g., a bitcell including gates, metal layers, vias) in the integrated circuit design. Packaging and assembly processes 938 are performed, which result in finished chips 940.

The EDA software 912 may be implemented in one or more computing devices including a memory. An example of a memory is a non-transitory computer readable storage medium. For example, the EDA software 912 is stored as instructions in the computer-readable storage medium which are executed by a processor for performing operations 914-932 of the design flow, which are described below. This design flow description is for illustration purposes. In particular, this description is not meant to limit the present disclosure. For example, an actual integrated circuit design may require a designer to perform the design operations in a difference sequence than the sequence described herein.

A cell library incorporating one or more NVM bitcells or circuits as described above with reference to FIGS. 1A through 6 may be stored in the memory. The cell library may be referenced by the EDA software 912 to create a circuit or electronic device incorporating the NVM bitcells or circuits.

During system design 914, designers describe the functionality to implement. They can also perform what-if planning to refine the functionality and to check costs. Note that hardware-software architecture partitioning can occur at this stage. During logic design and functional verification 916, VHDL or Verilog code for modules in the circuit is written and the design is checked for functional accuracy. More specifically, the design is checked to ensure that it produces the correct outputs. During synthesis and design for test 918, VHDL/Verilog is translated to a netlist. This netlist can be optimized for the target technology. Additionally, tests can be designed and implemented to check the finished chips. During netlist verification 920, the netlist is checked for compliance with timing constraints and for correspondence with the VHDL/Verilog source code.

During design planning 922, an overall floor plan for the chip is constructed and analyzed for timing and top-level routing. Example EDA software products from Synopsys, Inc. of Mountain View, Calif. that can be used at this stage include: Astro® and IC Compiler® products. During physical implementation 924, the placement (positioning of circuit elements) and routing (connection of the same) occurs. During analysis and extraction 926, the circuit function is verified at a transistor level, which permits refinement. During physical verification 928, the design is checked to ensure correctness for: manufacturing, electrical issues, lithographic issues, and circuitry. During resolution enhancement 930, geometric manipulations of the layout are performed to improve manufacturability of the design. During mask-data preparation 932, the 'tape-out' data for production of masks to produce finished chips is provided.

Embodiments of the present disclosure can be used during one or more of the above-described stages. Specifically, in some embodiments the present disclosure can be used in EDA software 912 that includes operations between design planning 922 and physical implementation 924.

Figure 10:
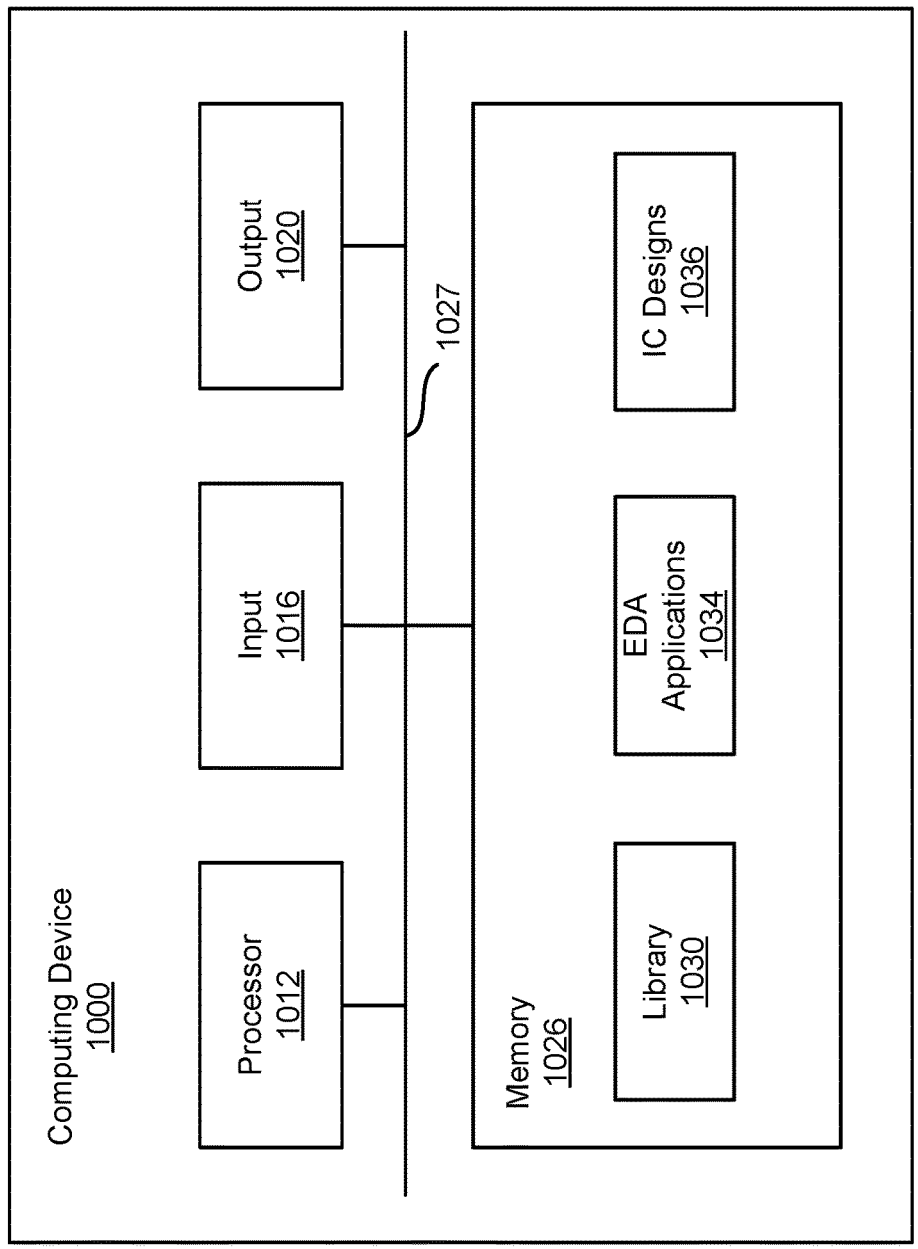
FIG. 10 is a block diagram of a computing device for designing a circuit, according to one embodiment.

FIG. 10 is a block diagram of a computing device 1000 for performing designing operations associated with OTP memory devices. The computer device 1000 may include, among other components, a processor 1012, an input module 1016, an output module 1020, a memory 1026 and a bus 1027 for connecting these components. The processor 1012 executes instructions stored in the memory 1026. The input module 1016 may include various devices for receiving user input, including keyboards and pointing devices (e.g., mouse and touch screen). The output module 1020 includes a display device or interface device for communicating with the display device.

The memory 1026 is a non-transitory computer readable storage medium storing, among others, library 1030, electronic design automation (EDA) applications 1034 and integrated circuit (IC) designs 1036. The library 1030 may include data on various circuit components, including instances of OTP memory device describe herein. The EDA applications 1034 may include various software programs for designing ICs, including place and route tools, synthesis tools, and verification tools. The design processed by the EDA applications 1034 may be stored in IC designs 1036. The IC designs 1036 may be an entire operational circuit or a part of a larger IC circuit.

Although the above embodiments were described primarily with reference to NMOS processes with n-doped sources, n-doped drains, p-doped wells and p-doped low doped regions, the polarity of the substrate and the devices can be reversed. That is, the embodiments described herein are equally applicable to PMOS devices as well as NMOS devices.

The bitcell has wide applicability. For example, the bitcell may be used as an alternative to expensive flash memory. Flash memory is expensive because it requires a number of additional process steps to create that are not part of the standard CMOS logic process and it adds a significant amount of heat. In contrast, the bitcell can be constructed using the existing CMOS logic process no additional process steps.

Upon reading this disclosure, a reader will appreciate still additional alternative structural and functional designs through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A one-time programmable memory device comprising:
 a first doped region of a first polarity and a first doping concentration in a semiconductor substrate;
 a second doped region of the first polarity in the semiconductor substrate, the second region having a second doping concentration that is higher than the first doping concentration;
 a source region of a second polarity that is opposite the first polarity in the semiconductor substrate, the source region positioned over the first doped region;
 a drain region of the second polarity in the semiconductor substrate, the drain region positioned over the second doped region;

a select device configured to form a channel in a channel region between the source region and the drain region;

a plurality of anti-fuse devices separated by a portion of the first doped region, each of the plurality of anti-fuse devices positioned at least in part above a respective portion of the source region;

a first metal line coupled to a first subset of the plurality of anti-fuse devices, each anti-fuse device of the first subset positioned between a respective pair of anti-fuse devices of a second subset of the plurality of anti-fuse devices; and a second metal line coupled to the second subset of the plurality of anti-fuse devices.

2. The one-time programmable memory device of claim 1, wherein:

the select device comprises a gate oxide of a first thickness and a conductive gate above the gate oxide; and each of the plurality of anti-fuse devices comprises a gate oxide of a second thickness thinner than the first thickness.

3. The one-time programmable memory device of claim 1, wherein the first doping concentration is a native doping concentration.

4. The one-time programmable memory device of claim 1, wherein the second doping concentration is at least twice the first doping concentration.

5. The one-time programmable memory device of claim 1, wherein a first breakdown voltage between the source region and the first region is at least two volts higher than a second breakdown voltage between the drain region and the second region.

6. The one-time programmable memory device of claim 1, wherein the source region and the drain region have a same doping concentration.

7. The one-time programmable memory device of claim 1, wherein the voltage applied to the first metal line and the voltage applied to the second metal line are independently controlled.

8. The one-time programmable memory device of claim 7, wherein a gate oxide of a selected anti-fuse device of the first subset of the plurality of anti-fuse devices is ruptured by applying a rupture voltage at the first metal line while the second metal line is set at an intermediate voltage lower than the rupture voltage for preventing punch-through between the selected anti-fuse device and at least one other anti-fuse device in the second subset adjacent to the selected anti-fuse device.

9. The one-time programmable memory device of claim 1, wherein the source region extends underneath the plurality of anti-fuse devices to a shallow trench isolation (STI).

10. The one-time programmable memory device of claim 1, wherein each anti-fuse device corresponds to one bitcell.

11. A one-time programmable memory device comprising:

a first doped region of a first polarity and a first doping concentration in a semiconductor substrate;

a second doped region of the first polarity in the semiconductor substrate, the second region having a second doping concentration that is higher than the first doping concentration;

a source drain region of a second polarity that is opposite the first polarity, the source drain region positioned in the semiconductor substrate over the first doped region;

a first plurality of anti-fuse devices, each positioned above a respective portion of the first doped region and a respective portion of the source drain region; and a second plurality of anti-fuse devices, each positioned above a respective portion of the first doped region and a respective portion of the source drain region, and each positioned between a respective pair of anti-fuse devices of the first plurality of the anti-fuse devices, wherein the first plurality of anti-fuse devices and the second plurality of anti-fuse devices are applied with different voltage levels to prevent punch-through from an anti-fuse device of the first plurality of anti-fuse devices to an adjacent anti-fuse device of the second plurality of anti-fuse devices.

12. The one-time programmable memory device of claim 11, further comprising:

a first metal line coupled to a first subset of the plurality of anti-fuse devices; and a second metal line coupled to a second subset of the plurality of anti-fuse devices.

13. The one-time programmable memory device of claim 11, further comprising:

a drain region of the second polarity, the drain region positioned over the second doped region; and a select device configured to form a channel in a channel region between the source drain region and the drain region.

14. The one-time programmable memory device of claim 13, wherein:

the select device comprises a gate oxide of a first thickness and a conductive gate above the gate oxide; and each of the first plurality of anti-fuse devices and second plurality of anti-fuse devices comprises a gate oxide of a second thickness, thinner than the first thickness.

15. The one-time programmable memory device of claim 11, wherein the source drain region extends underneath the first plurality of anti-fuse devices and the second plurality of anti-fuse devices to a shallow trench isolation (STI).

16. The one-time programmable memory device of claim 11, wherein each anti-fuse device in the first plurality of anti-fuse devices and the second plurality of anti-fuse devices corresponds to one bitcell.

17. A one-time programmable memory device comprising:

a first doped region of a first polarity and a first doping concentration in a semiconductor substrate;

a second doped region of the first polarity in the semiconductor substrate, the second region having a second doping concentration that is higher than the first doping concentration;

a source region of a second polarity that is opposite the first polarity, the source region in the semiconductor substrate positioned over the first doped region;

a drain region of the second polarity in the semiconductor substrate, the drain region positioned over the second doped region;

a select device configured to form a channel in a channel region between the source region and the drain region;

a plurality of anti-fuse devices, each positioned at least in part above a respective portion of the source region; and wherein the first doping concentration is selected so that the breakdown voltage between the first doped region and the source region is higher than a rupture voltage used to form an anti-fuse at an anti-fuse device of the plurality of anti-fuse devices.

18. The one-time programmable memory device of claim 17, wherein the first doping concentration is at least one of:

a native doping concentration of a substrate used to form the memory device;

a doping concentration of an epitaxial layer; and a doping concentration of a high-voltage well.

19. The one-time programmable memory device of claim 17, wherein the second doping concentration is at least twice the first doping concentration.

20. The one-time programmable memory device of claim 17, wherein a first breakdown voltage between the source region and the first region is at least two volts higher than a second breakdown voltage between the drain region and the second region.

21. A non-transitory computer-readable storage medium storing digital representation of a one-time programmable memory device, the one-time programmable memory device comprising:

- a first doped region of a first polarity and a first doping concentration in a semiconductor substrate;
- a second doped region of the first polarity in the semiconductor substrate, the second region having a second doping concentration that is higher than the first doping concentration;
- a source region of a second polarity that is opposite the first polarity in the semiconductor substrate, the source region positioned over the first doped region;
- a drain region of the second polarity in the semiconductor substrate, the drain region positioned over the second doped region;
- a select device configured to form a channel in a channel region between the source region and the drain region;
- a plurality of anti-fuse devices separated by a portion of the first doped region, each of the plurality of anti-fuse devices positioned at least in part above a respective portion of the source region;
- a first metal line coupled to a first subset of the plurality of anti-fuse devices, each anti-fuse device of the first subset positioned between a respective pair of anti-fuse devices of a second subset of the plurality of anti-fuse devices; and
- a second metal line coupled to the second subset of the plurality of anti-fuse devices.

\* \* \* \* \*